ELECTRICAL CONNECTORS FOR PRINTED CIRCUIT BOARDS

ELECTRICAL CONNECTORS FOR PRINTED CIRCUIT BOARDS

Filed Jan. 29, 1968 4 Sheets-Sheet 2

ELECTRICAL CONNECTORS FOR PRINTED CIRCUIT BOARDS

Aug. 11, 1970 R. H. FRANTZ ET AL 3,524,161

ELECTRICAL CONNECTORS FOR PRINTED CIRCUIT BOARDS

Filed Jan. 29, 1968 4 Sheets-Sheet 4

United States Patent Office 3,524,161

Patented Aug. 11, 1970

3,524,161

ELECTRICAL CONNECTORS FOR PRINTED CIRCUIT BOARDS

Robert Houston Frantz and Homer Ernst Henschen, Carlisle, Pa., assignors to AMP Incorporated, Harrisburg, Pa.

Filed Jan. 29, 1968, Ser. No. 701,365

Int. Cl. H05k *1/18;* H01r *9/16*

U.S. Cl. 339—176 15 Claims

ABSTRACT OF THE DISCLOSURE

Multi-contact electrical connector for printed circuit board comprises thin-walled channel-shaped housing of insulating material having spaced-apart contact terminals therein. Housing comprises web and sidewalls, the sidewalls being relatively flexible towards and away from each other by virtue of the thinness of the material. Contact terminals have portions extending through openings in the web of the housing and have means on their sides which interengage with the housing sidewalls. Housing sidewalls are supported and held in position by the contact terminals and terminals, in turn, are supported in the spaced-apart parallel relationship by the housing.

BACKGROUND OF THE INVENTION

Multi-contact electrical connectors commonly comprise an insulating housing having a plurality of electrical contact terminals mounted therein. A wide variety of housing and contact types are available to meet the specialized needs of the many branches of the electrical and electronics industries. Connectors in accordance with the instant invention can take a variety of forms and can be provided with different types of contact terminals. In the interest of coherence, the background of the invention is described immediately below with reference to a well-known type of printed circuit board connector. Alternative embodiments of the invention, which relate to different types of connectors, are described at the end of the specification.

One type of electrical connector commonly used for printed circuit boards comprises a generally channel-shaped housing member having a plurality of contact terminals mounted therein in parallel spaced-apart relationship to each other. The printed circuit board is inserted into the trough between the sidewalls of the connector in a manner such that the contact terminals engage, and make contact with, conductors on the surface of the board. The housings, which are usually of plastic material, are commonly manufactured by molding processes and are supplied by the manufacturers in a range of sizes having different numbers of "positions" (i.e., contact terminals adapted to engage conductors on the printed circuit board). Because of manufacturing cost limitations, and particularly because of the cost of the molds for making such housings, it is not possible to supply connector housings in every possible size. Most manufacturers will supply several sizes of a given type of connector, each size having a commonly used number of positions.

A comparative shortcoming of connectors of the above described type is that it is frequently necessary to use a larger size connector housing than is required in order to provide an adequate number of positions for contacts to engage an inserted printed circuit board. For example, if the circuit designer requires an electrical connector that will make electrical contact with thirteen conductors on a printed circuit board, and if the type of connector he is using comes in a ten position size and a fifteen position size, he must use the fifteen position size housing although he requires only thirteen of the fifteen positions available. This expedient is financially wasteful since the cost of the connector increases with the number of positions therein. The expedient is also wasteful of space since the connector is longer than it actually need be and the available space is usually limited in devices utilizing printed circuit boards.

An object of the present invention is to provide an improved multi-contact connector. A further object is to provide a connector which can be made in any desired size, that is, having any desired number of contact positions. A further object is to provide a connector which can be manufactured at an extremely low cost and which occupies a minimum of space.

These and other objects of the invention are achieved in one preferred embodiment of the invention comprising a supporting means in the form of a channel-shaped housing having a base and a pair of sidewalls. The housing is preferably formed by stamping and forming a relatively thin insulating material so that the sidewalls are normally flexible towards and away from each other. The base of the housing is provided with a plurality of spaced-apart transversely extending contact-receiving openings and the sidewalls are provided with windows or openings on each side of these openings in the housing base. The contact terminals are of the fork-type, in accordance with one embodiment of the invention, and are inserted through openings in the base so that their arms extend along the sidewalls of the housing. Interengaging means are provided on the arms and sidewalls to secure the housing sidewalls to the arms of the contacts. The contacts, being relatively rigid, hold the sidewalls in their proper insulating relationship to the terminals and the housing, in turn, supports the terminals in parallel spaced-apart relationship. A significant feature of the invention is that the terminals constitute a supporting structure for the connector housing. By virtue of this fact, the housing itself can be of relatively thin-walled material and need not be heavy and bulky as are previously known connector housings.

In the foregoing brief description, the contact terminals are referred to as being of the "fork-type." As will be explained more fully hereinbelow, the principles of the invention are applicable to connectors having contact terminals other than "fork-type" terminals therein. The actual scope of the invention is defined by the appended claims when read in their proper perspective against the prior art.

Figures 1, 2:
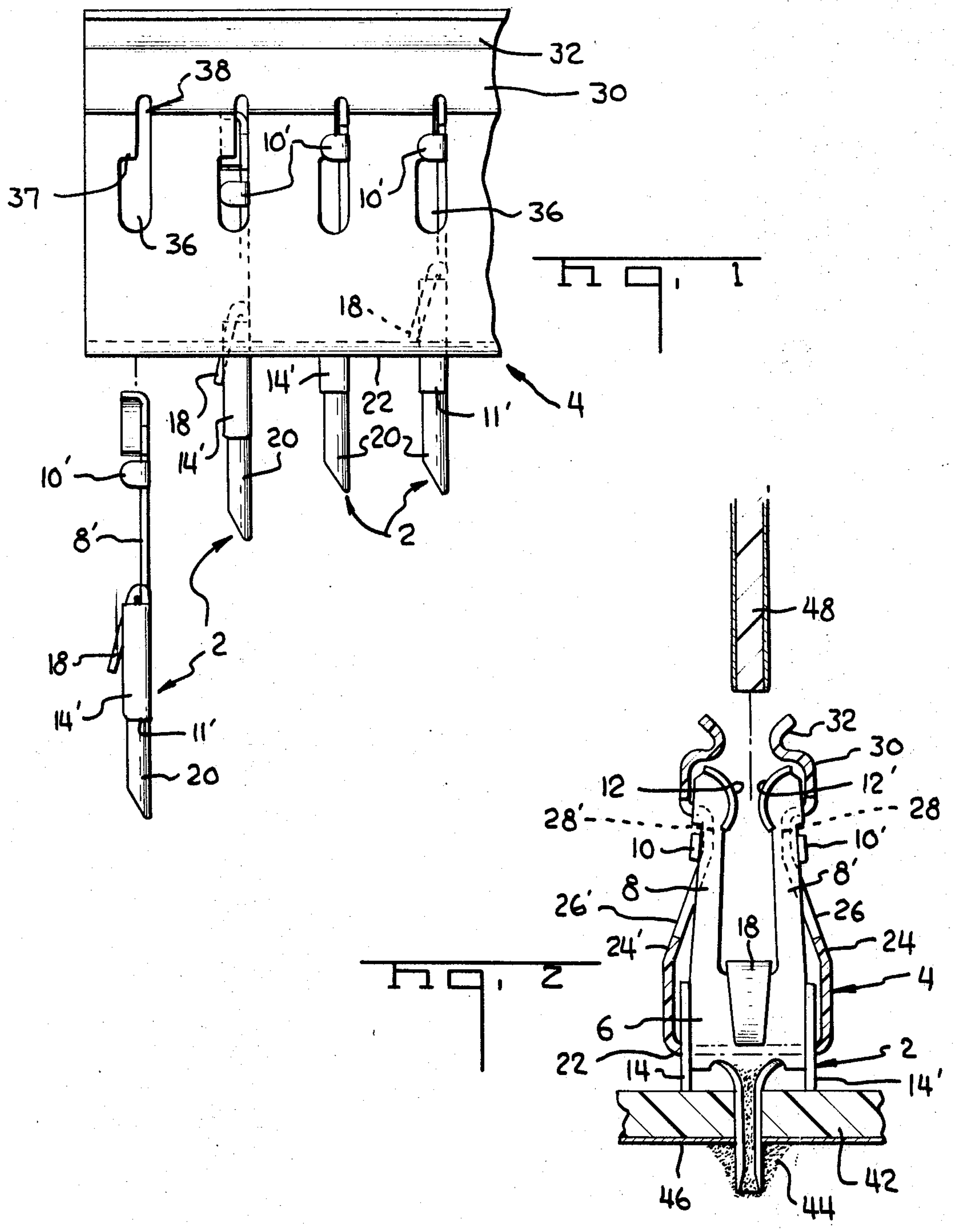
FIG. 1 is a side view of a connector in accordance with the invention showing one of the contact terminals removed from the housing and illustrating the manner in which these terminals are inserted into the housing.
FIG. 2 is a sectional side view of the connector of FIG. 1 showing the connector mounted on a printed circuit mother board and showing the manner in which a daughter board is inserted into the connector.
Figures 3, 4:
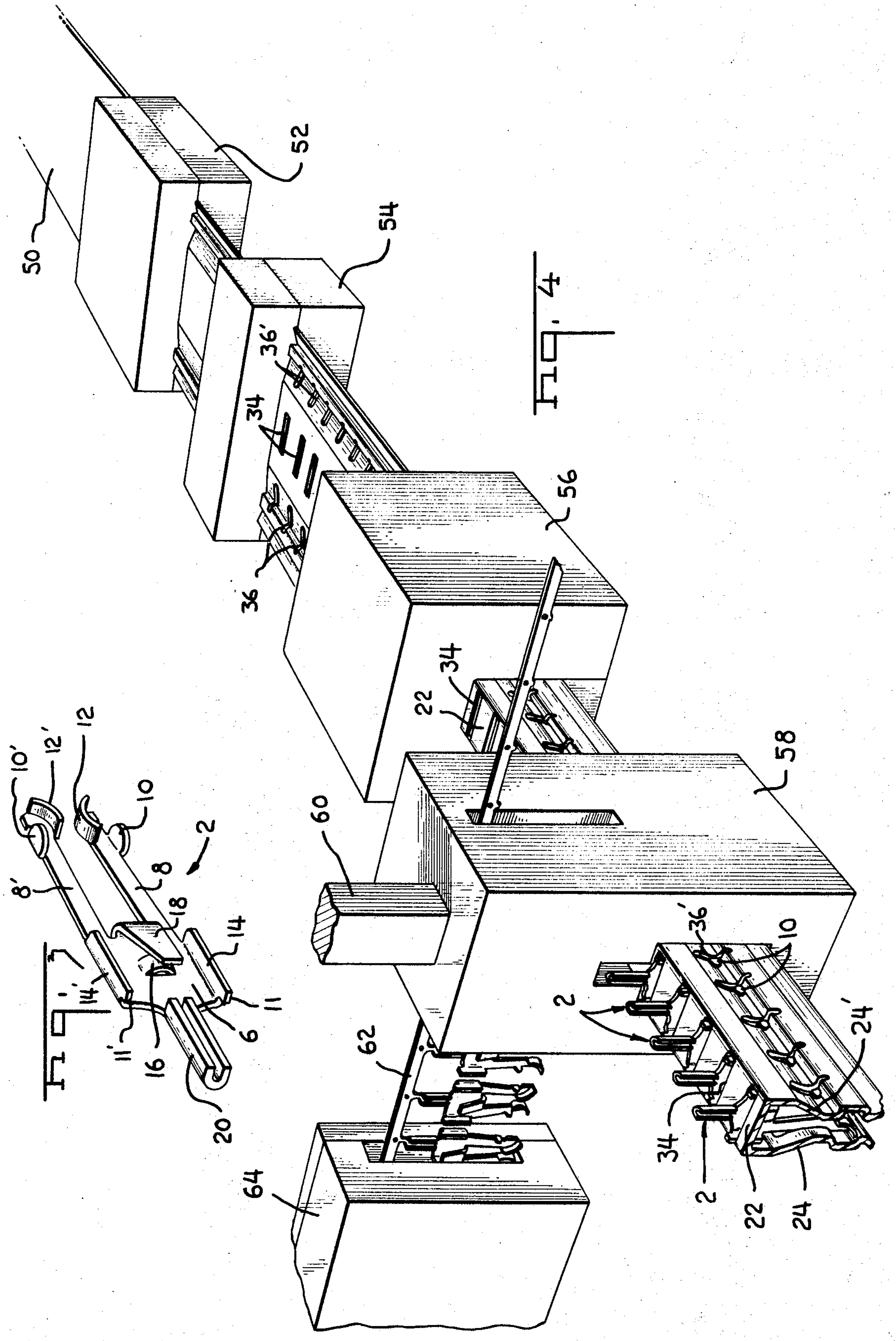
FIG. 3 is a perspective view of a contact terminal of the type used in the embodiment of FIG. 1.
FIG. 4 is a schematic perspective view illustrating the manner in which a connector in accordance with the invention can be formed and the manner in which the contact terminals are inserted into the connector housing.

The embodiment of the invention disclosed in FIGS. 1–3 comprises a connector which is adapted to be used with contacts 2 of the general type disclosed and claimed in application Ser. No. 653,419, filed July 14, 1967, by Robert J. Kinkaid. The terminal 2 is of the fork-type and has a yoke portion 6 from which a pair of arms 8, 8′ extend. These arms have laterally extending ears 10, 10′ on their outwardly facing edges and have arcuate contact surfaces 12, 12′ on their ends. These contact surfaces are opposed to each other and are adapted to engage the conductors of a circuit board. The yoke portion 6 of the terminal has laterally extending flanges 14, 14′ on its edges and has an outwardly extending boss 16 disposed between these flanges. This boss is intended to function as a stop for a reversely bent retaining tongue 18 formed from the material which was originally located between the arms 8, 8′. As will be explained below, the tongue 18 functions to retain the individual terminals in the connector housing. The contact terminal shown has a rearwardly extending short post 20 integral with the yoke 6 by means of which it is soldered to a conductor of a printed circuit board. Spurs 11, 11′ extend rearwardly from the flanges 14, 14′ on each side of the post 20.

The housing 4 in accordance with the invention is of U-shaped or channel-shaped cross-section having a base or web 22 from which a pair of sidewalls 24, 24′ extend, the base or web acting as a connecting section between the sidewalls. As shown best in FIG. 2, these sidewalls extend normally from the base thence inwardly and towards each other at 26, 26′ so that their opposed sides or faces are relatively adjacent to each other 28, 28′ to form a constricted zone. The marginal upper portions of the sidewalls, as viewed in FIG. 2, are outwardly formed as shown at 30 above this constricted zone and the extreme upper portions 32 are inwardly, then outwardly, curved to provide a lead-in or guiding surface for the printed circuit board 48.

The web or base 22 is provided with a plurality of spaced-apart transversely extending openings 34, the width of which is sufficient to receive the terminals as illustrated in FIGS. 1 and 2. Additionally, the sidewalls are provided with windows 36 on each side of the openings 34, the windows 36 being of reduced width at their upper ends to facilitate latching of the terminals in the housing.

The housing 4 is advantageously of a relatively thin walled insulating material such as rigid or semi-rigid plastic which may be hot or cold formable. For example, housings in accordance with the invention can be manufactured by die stamping and forming operations performed on an endless strip of polyvinyl chloride or polyvinyl dichloride. These materials can be formed in the same manner as metal strip if they are heated during the stamping operations. Housings in accordance with the invention can also be formed of non-polymeric materials such as insulating paper.

The contact terminals are mounted in the connector housing by inserting them through the openings 34 in the web 22 as illustrated in FIG. 1. During insertion, the arms 24, 24′ initially move over the internal surfaces of the sidewalls and the ears 10, 10′ move relatively through the sidewall openings 36, 36′. Upon further inward movement of the contact terminal relative to the housing, the ears 10, 10′ move over the external surface portions 37 of the sidewalls adjacent to the window 36 so that the sidewalls 24 become locked to the arms 8 of the terminals. Since the terminal arms are stiffly flexible only to the extent necessary to accommodate the printed circuit board, the terminals function to hold the sidewalls in their proper protective relationship around the terminals in the housing. The retaining tongues 18 of the terminals lodge against the internal surface of the web or base 22 of the housing thereby prevent unintentional removal of the terminals from the housing.

It should be noted that the base portion of the web 6 of each terminal substantially fills the opening 34 in which the terminal is mounted. The width of the base portion is substantially equal to the transverse dimension of the opening and the flanges 14, 14′ are of a height such that they extend for substantially the full width of the opening. This relatively close fit of the base portion 6 of each terminal in its opening coupled with the interlock of the terminal arms with the housing sidewalls has the effect of supporting the terminals in parallel spaced-apart relationship. The terminals and the housing are thus interdependent; the housing supports the terminals in parallel spaced-apart relationship and the terminals support the housing sidewalls against outward movement relative to the row of terminals.

The disclosed embodiment of the invention is adapted to be used in conjunction with a printed circuit mother board 42 which will ordinarily have a multiplicity of relatively smaller printed circuit boards 48, commonly called daughter boards, mounted thereon. When a connector is to be mounted on the mother board 42, it is positioned on the board with the post portions 20 of the terminals in alignment with a plurality of openings in the board. The connector is then moved downwardly as viewed in FIG. 2 until the post portions extend through these openings in the board. The mother board 42 can then be solder dipped to form soldered connections 44 between the conductors 46 on the underside of the mother board and post portions of the individual contact terminals in the connector. As best shown in FIG. 2, the spurs 11, 11′ which extend from the flange portions on the terminal project downwardly, as viewed in FIG. 2, beyond the lower surface of the base 22 of the connector housing. These spurs bear against the upper surface of the mother board 42 and function to hold the connector assembly elevated above the mother board thereby to provide a flux vent during the soldering operation.

When the daughter board 48 is inserted into a connector in accordance with the invention, the daughter board is physically supported by the terminals 2; in other words, the surface of the board is gripped between the contact surfaces 12, 12′ of the terminals which make contact with the conductors on the daughter board and physically clamp the daughter board above the mother board. The lower edge of the daughter board may also rest on the curved surfaces 14 of the retaining lances 18 of the contacts to provide additional physical support for the daughter board. Since the contact terminals are firmly soldered at 44 to the mother board 42, they are capable of supporting the daughter board. The housing, while it is not of heavy walled plastic as with prior art devices, is fully adequate for its insulating and protective functions, but does not function to support the daughter board.

FIG. 4 shows schematically a production line for manufacturing connectors in accordance with the invention and completed connector housings. The strip 50 of plastic material, which may be of polyvinyl chloride as noted above, is first passed between a set of reciprocating forming dies indicated at 52. These dies delinate the web 22 portion of the housing and, at the same time, impart the irregular configuration of the sidewalls to the strip on each side of this web. The strip is then fed to a punch and die set 54 by means of which the openings in the web and the sidewalls are provided. The strip is then fed through a forming die mechanism shown at 56 which bends the sidewalls downwardly as viewed in FIG. 4 to produce the completed housing having the channel-shaped cross-section shown in FIG. 2. The strip of plastic material would, depending upon its composition, be heated for at least the forming operations formed by the die set 52 and the bending operations formed by the die mechanism 56. As previously noted, the invention can be practiced with cold formable materials in which case heating would not be necessary.

As an alternative to the stamping and forming manufacturing method disclosed in FIG. 4, connector housings in accordance with the invention can be produced by conventional extrusion processes. The continuously produced channel-shaped housing would, with this alternative manufacturing process, be subjected to a subsequent punching operation to form the holes in the web and in the sidewalls. It should also be mentioned that the walls of the housing need not necessarily be extremely thin as shown in the drawing but may be relatively thick and rigid with respect to web of the connector.

Figures 5, 8:
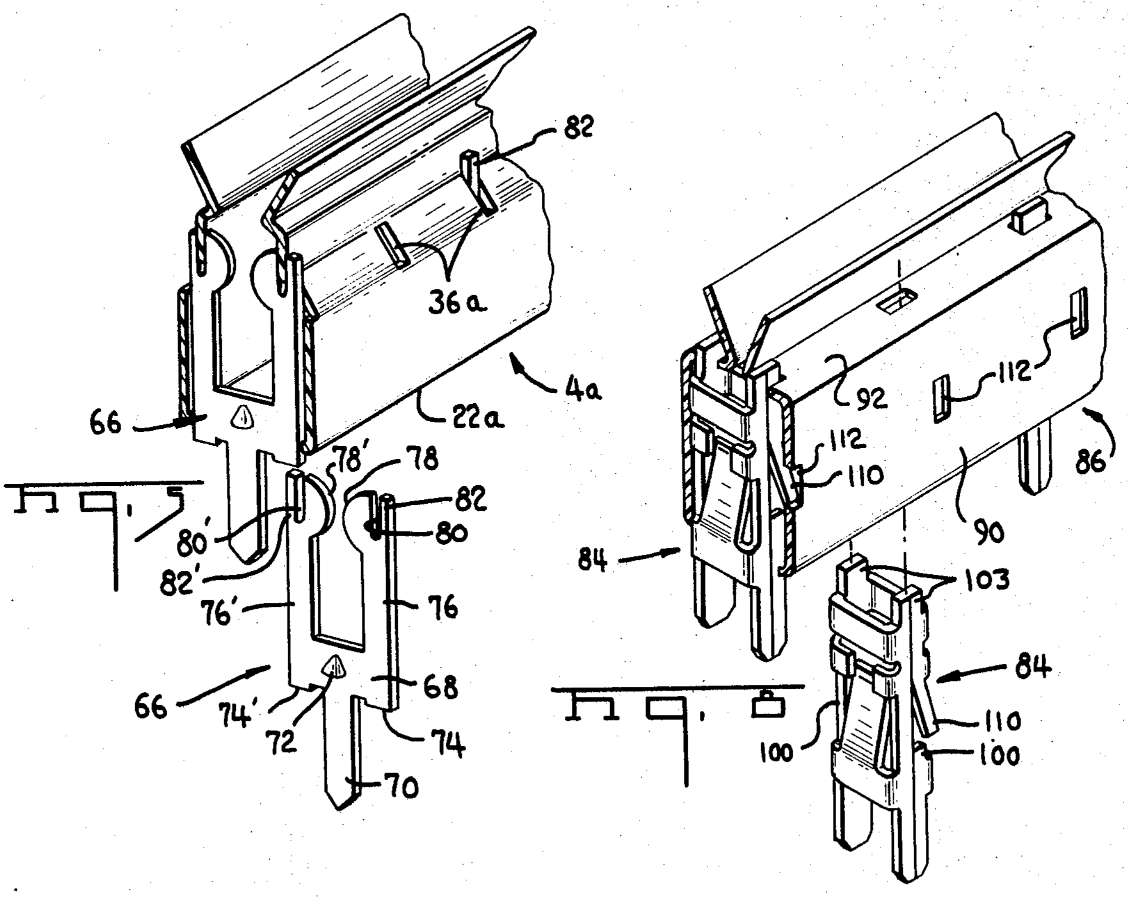
FIG. 5 is a perspective view of a connector in accordance with an alternative embodiment of the invention.
FIG. 8 is a perspective view of a connector in accordance with a further embodiment of the invention.

FIG. 5 shows an alternative embodiment of the invention which is similar in most respects to the embodiment of FIG. 1. The contact terminal 66 of this alternative embodiment comprising a relatively simple flat stamped and formed fork-type terminal having a yoke 68, an integral downwardly extending post 70, a pair of parallel arms 76, 76′ having contact surfaces 78, 78′ on their ends, a retaining boss 72, and a pair of supporting spurs 74, 74′ extending downwardly from the yoke on each side of the post. The upper ends of the arms 76, 76′ are notched as shown at 80. When the contacts are assembled to the housing **4*a*, the ear portions 82, 82′ of the contact arms are passed through the windows 36*a* so that portions of the housing sidewalls above the windows enter the notches 80, 80′ thereby to secure the terminals to the housings. The housing of FIG. 5 is similar to the housing of FIG. 1 except that the windows 36*a* are in the form of narrow slits having a width only slightly greater than the thickness of the metal stock of the terminal. The openings in the web 22*a* through which the contacts are inserted are relatively narrow since the terminal yoke is not provided with flanges on its sides as is the terminal 2** of FIG. 1.

Figure 6:
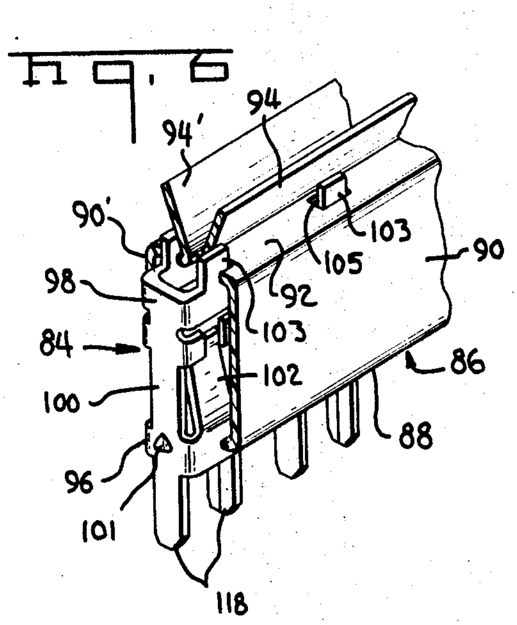
FIG. 6 is a perspective view of a further embodiment of the invention.
Figures 7, 11, 12:
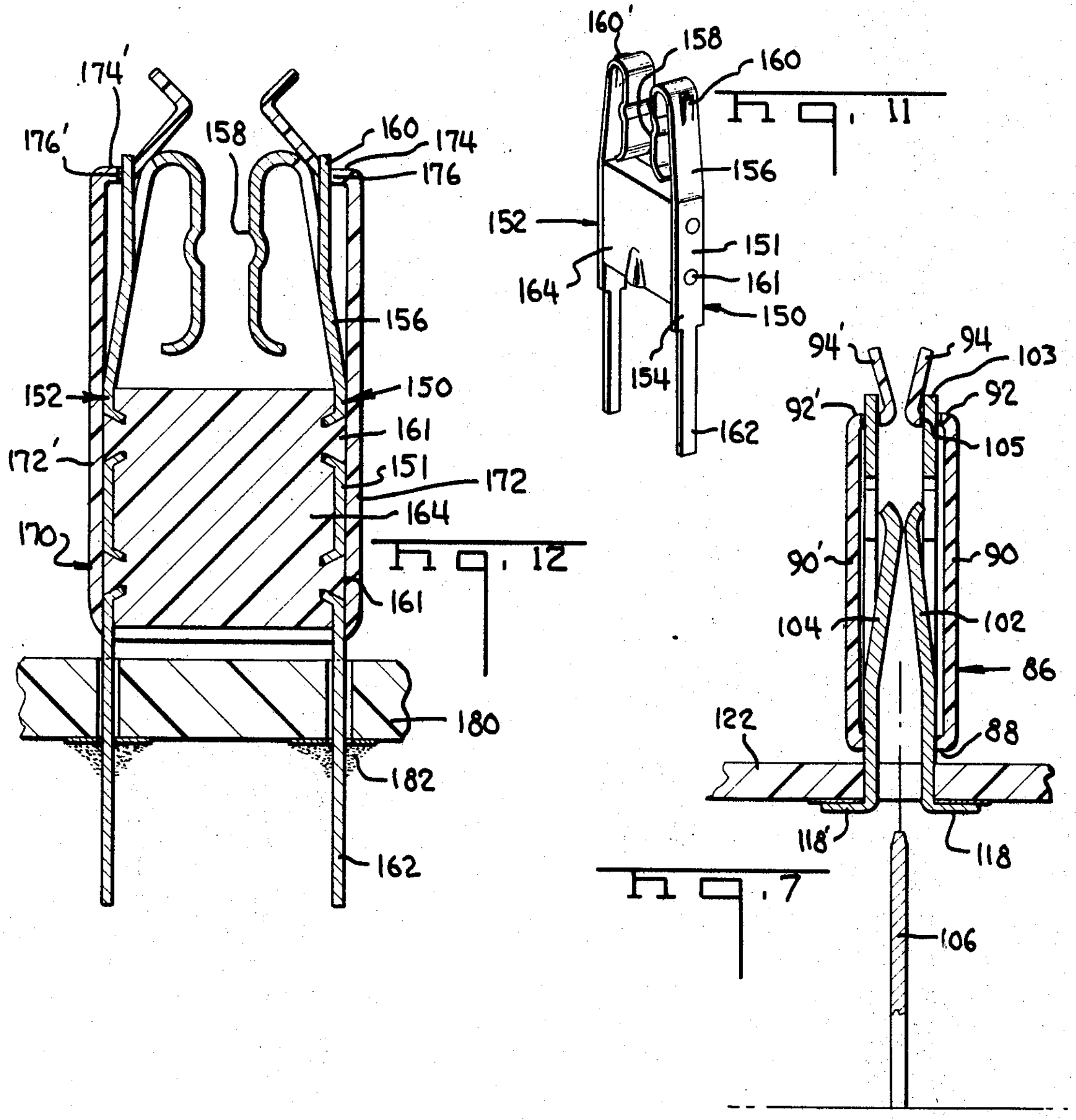
FIG. 7 is a sectional side view of a connector in accordance with the embodiment of FIG. 6; this view showing the connector mounted on a printed circuit board and showing a blade member in alignment with one of the contact terminals in the connector.
FIG. 11 is a perspective view of an alternative fork-type terminal in accordance with the invention.
FIG. 12 is a sectional side view of a connector mounted on a printed circuit board, the connector containing terminals of the type shown in FIG. 11.

FIGS. 6 and 7 show an embodiment of the invention in which the electrical contact terminals comprise socket members 84 of the general type disclosed in U.S. Pat. No. 3,270,251. The housing 86 of this embodiment comprises a web 88 having upstanding sidewalls 90, 90′ which are inwardly turned at 92, 92′ to define ledges. The marginal upper portions 94, 94′ of the sidewalls diverge as with previously described embodiments.

The individual contact terminal sockets 84 comprise a pair of square end frame sections 96, 98 which are connected to each other on opposite sides by means of connecting strip portions 100. The contact sockets are manufactured by conventional stamping and forming operations so that an axial seam will extend along one of these strap portions for the full length of the contact as shown in FIG. 6. A boss or lance 101 is formed on one of the connecting strap sections 100 adjacent to the frame section 96 and functions to retain the contact in the housing as previously described. The contact springs 102, 104 extend from the frame section 96 on the remaining opposite sides and between the connecting straps 100. These springs converge at their upper ends as shown in FIG. 7 so that they will engage a contact blade 106 in a manner described below. Ears 103 extend upwardly from the frame section 98 on opposite sides thereof and are adapted to project through windows 105 on the ledge portions 92, 92′ of the housing. As with the previously described embodiments, the contact terminals are assembled to the housing by inserting them through openings in the web portion of the housing until the retaining bosses 101 pass beyond the inner surface of the web. The connector is mounted on the printed circuit board 122 by means of legs 118 which extend downwardly from the frame section 96. These legs are passed through a rectangular opening in the printed circuit board and are then bent outwardly and soldered to the conducting paths on the underside of the board as viewed in FIG. 7.

Contact terminals of the type shown in FIGS. 6 and 7 are adapted to be used in stacking type packaging arrangements for electrical components in which several boards are stacked on top of each other in spaced-apart relationship. Electrical connections between the boards are made by means of terminal posts as shown at 106, it being understood that in FIG. 7, the post 106 may be mounted in a connector which, in turn, is mounted on a printed circuit board disposed below, and parallel to, the board 122. It will be apparent from FIG. 7 that upon relative upward movement of the post 106, the post 106 will move between the contact springs 102, 104 and bias them away from each other thereby to establish electrical contact between the contact terminal shown in FIG. 7 and the post 106.

FIG. 8 shows an embodiment which is substantially similar to the embodiment of FIG. 6 and 7 except that the contact terminals 84 are oriented with the connecting strap portions 100 against the sidewalls 90 of the housing. Again, ears 103 on the upper ends of the contact terminals extend through suitable windows in the ledge portions 92 of the housing. Additional retention is achieved by means of lances 110 struck from the connecting strap portions 100 of the terminals. These lances project through windows 112 in the sidewalls 90 of the housing. The embodiment of FIG. 8 demonstrates that the contact portions of the terminals need not necessarily be disposed against the sidewalls of the connector housing but can extend normally of the sidewalls. The embodiment of FIG. 8 is mounted on the printed circuit board in the same manner as the embodiment of FIG. 6 as illustrated in FIG. 7.

Figure 9:
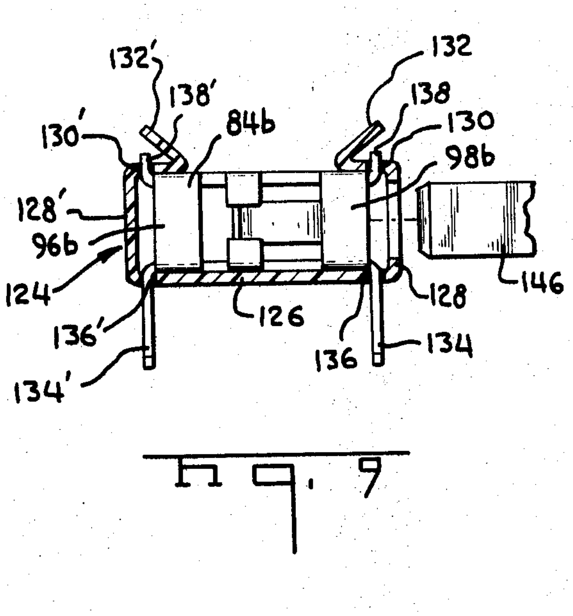
FIG. 9 is a sectional side view of a connector in accordance with another embodiment of the invention.
Figure 10:
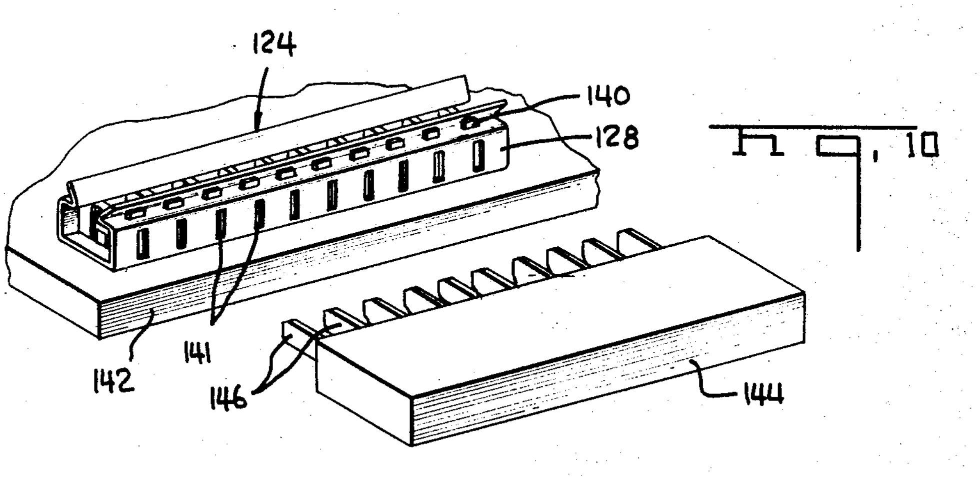
FIG. 10 is a perspective view of a conector in accordance with the embodiment of FIGURE 9 mounted on a printed circuit board.

FIGS. 9 and 10 show a further embodiment of the invention in which the contact terminals **84*b* are again of a general type disclosed in the above-identified U.S. Pat. No. 3,270,251. In this instance, the contact terminals are mounted on the printed circuit board 142 with their axes extending parallel to the plane of the board, the external connections to the board being made by means of blade members 146 which enter the contact sockets from the side of the connector housing. The housing 124 of this embodiment has a relatively wide web 126 in order to accommodate the maximum dimension of the contact sockets and has relatively low sidewalls 128 which are inwardly turned at their upper edges to define ledges 130, the marginal upper portions of the sidewalls being again divergently directed as shown at 132. The individual contact terminals are retained in the housing by means of ears 138 which project laterally from opposite frame sections 96*b*, 98*b* and which extend through suitable windows 140 in the ledge portions of the housing. The legs 134, 134′ which are integral with the frame sections 96*b*, 98*b* extend laterally of the contact socket axis and through openings 136 on opposite sides of the web. The individual contact members 84*b* are assembled to the housing by spreading the sidewalls slightly, moving the contact members downwardly until the legs 134, 134′ extend through the openings 136, 136′, and then allowed the sidewalls to return to their normal positions so that the ear members 138 will extend through the windows in the ledge portions of the sidewalls. As with the embodiments of FIGS. 6 and 8, the connector of FIG. 9 is assembled to the printed circuit board 142 by moving the connector against the board until the legs 134, 134′** of the contact terminals extend through openings in the board. The legs are then bent laterally and soldered to the conducting paths (not shown) on the underside of the board. In FIG. 10, the blades 146 which are adapted to enter the windows 141 on the sidewall 128 of the connector and engage the contact sockets of the connector shown are mounted in a connector 144. It will be understood that this connector would normally be mounted on an adjacent printed circuit board, as more fully described in the above-identified Pat. 3,270,251.

FIGS. 11 and 12 show an embodiment of the invention in which the individual contact members are each composed of two electrically separate leaf-type contacts 150, 152. Each leaf-type contact comprises an intermediate shank portion 151, an extension 156 which is reversely bent to define a contact portion 158, and a post portion 162. The retaining ear 160 is a struck from the extension 156 adjacent to the bight of the bend and functions to retain the contact in the housing as shown in FIG. 12. The two contact members 150, 152 are mechanically secured to each other by means of a plastic yoke or base member 164. As shown in FIG. 11, the shank portions 151 of the two contacts are disposed against oppositely facing sides of this yoke member and secured to the sides by boses 161 on the yoke which extend through openings in the shank portions of the terminals, the bosses being upset or headed at the time of assembly. This technique for securing a stamped and formed contact terminal to a molded plastic part is described more fully in application Ser. No. 682,828, filed Nov. 14, 1967.

The housing 170 is again of channel-shape cross-section having sidewalls 172 against which the shank portions 154 of the terminals are disposed. The lance members 160 of the terminals are adapted to project through windows 176 in the ledge portions 174 of the sidewalls. The openings in the web portion of the housing may extend entirely across the web portion of the housing, as shown in FIG. 12, to permit insertion of the contact terminals through the web as disclosed with reference to the embodiment of FIG. 1 or alternatively two spaced-apart openings may be provided for each contact terminal to accommodate the post portions 162 of the terminal as described with reference to the embodiment of FIG. 9. In the latter case, insertion is achieved by springing the sidewalls of the housing apart, moving the contact terminals downwardly as viewed in FIG. 12 until the post portions extend through the openings, and then allowing the sidewalls to spring back to their normal positions until the lances 160 extend through the windows 176. As with previous embodiments, the post portions of the contact terminals may be soldered as shown at 182 to conductors on the underside of the printed circuit board 180.

From a mechanical or structural standpoint, the contact terminal of FIG. 11 is similar to the terminal of FIGS. 1 and 5, however, since two separate contact terminals are provided on each contact member, it is possible, with this embodiment, to establish separate electrical contact with conducting paths on opposite sides of the printed circuit board which is mounted in the connector.

It will be apparent from the foregoing description that in all of the embodiments described, a connector of any desired size, that is, having any desired number of positions, can be provided by merely cutting the connector housing to the appropriate length and mounting contact terminals therein. A further advantage is that connector housings in accordance with the invention can be manufactured and supplied at a very low cost and are nonetheless functionally adequate to insulate the individual contact terminals in the housing. A still further advantage of the invention is that it provides a convenient and simplified means for packaging individual contact terminals prior to their being applied to a printed circuit board and simplifies the assembly of the terminals to the board.

This latter advantage is demonstrated by the fact that heretofore it has been common practice to apply contact terminals of the types shown in FIGS. 6, 8, and 9 to printed circuit boards without connector housings by means of relatively complex staking machines of the type shown, for example, in U.S. Pat. No. 3,293,735. In this prior art practice, the contact terminals are manufactured in the form of a continuous strip and a reel of contact terminals is mounted on the staking machine. The printed circuit board is then positioned on the platen of the staking machine and an individual terminal is staked to the board during each cycle of operation. In accordance with the present invention, on the other hand, the contact terminals can, at the time of manufacture, be mounted in the housings. When the ultimate consumer of the terminals wishes to mount a given number of terminals on a printed circuit board, he merely cuts a section of the housing containing the required number of terminals, inserts the post portions of the terminals through openings in the printed circuit board, and thereafter solders these post portions to the conducting paths on the board. The invention thus eliminates the need for staking machines and provides the added advantage of an insulating housing for the contact terminals.

Changes in construction will occur to those skilled in the art and various apparently different modifications and embodiments may be made without departing from the scope of the invention. The matter set forth in the foregoing description and accompanying drawings is offered by way of illustration only.

What is claimed is:

1. Electrical connecting means comprising a supporting means and a plurality of contact terminal members in said supporting means, said supporting means comprising an elongated member of relatively thin walled insulating material having a pair of sidewalls and having a connecting section integral with each of said sidewalls along one of their longitudinal edges, a plurality of spaced-apart openings in said connecting section, said contact terminal members being between said sidewalls, each terminal member having a base portion disposed in one of said openings, said terminal members having opposed portions extending through, and interengaged with, said sidewalls, said opposed portions of said terminal members holding said sidewalls in position and functioning to brace said sidewalls and said terminal members being supported in spaced-apart side-by-side relationship by said supporting means.

2. Electrical connecting means comprising a housing and a plurality of contact terminal members in said housing, said housing having a generally U-shaped cross-section comprising a web and sidewalls, said housing being of a relatively thin-walled insulating material, said web having a plurality of spaced-apart openings therein, said contact terminal members being between said sidewalls, each terminal member having a base portion disposed in one of said openings, said terminal members having opposed portions extending along said sidewalls, said opposed portions being interengaged with said sidewalls, said opposed portions of said terminal members holding said sidewalls in position against the sides of said terminal members, and said terminal members being supported in spaced-apart side-by-side relationship by said housing.

3. Connecting means as set forth in claim 2 wherein said opposed portions of said terminal members are interengaged with said sidewalls by means of ears on said opposed portions and windows in said sidewalls, said ears extending through said windows.

4. A device as set forth in claim 3 including detent means effective between said base portion and each of said terminal members, said detent means preventing rearward movement of said terminal members through said openings.

5. A device as set forth in claim 4 wherein said detent means for each of said contact terminal members comprises a lance struck from the said base portion of each terminal member, said lances bearing against said web portion of said housing.

6. A device as set forth in claim 2 wherein each of said contact terminal members comprises a fork-type terminal, said opposed portions of each terminal comprising arms, said sidewalls having windows, said arms being interengaged with said sidewalls by means of ears on said arms extending through said windows.

7. A device as set forth in claim 2 wherein each of said contact terminal members comprises fork-type terminals said opposed portions of each terminal comprising arms, the free ends of said arms being notched, said sidewalls having spaced-spart windows, edge portions of said windows extending into said notches to effect said interengagement.

8. A device as set forth in claim 2 wherein each of said contact terminal members comprises a pair of spaced-apart contact terminals, said base portion of each terminal member comprising insulating material, said contact terminals being secured to said base portion on opposite sides thereof.

9. A device as set forth in claim 2 wherein said contact terminal members comprise contact sockets.

10. A device as set forth in claim 9 wherein said contact sockets are disposed in said housing with their axes extending parallel to said sidewalls.

11. A device as set forth in claim 9 wherein said contact sockets are disposed in said housing with their axes extending normally of said sidewalls, said sidewalls having spaced-apart openings adapted to receive contact blade members and to permit said blade members to enter said sockets.

12. A multi-contact electrical connector adapted to receive a printed circuit board, said connector comprising:

a generally channel-shaped housing, said housing being of a relatively thin insulating material and having a web and a pair of sidewalls, said sidewalls being flexible towards and away from each other,
contact terminals in said housing, said terminals having a pair of parallel spaced-apart arms, said arms being integral with each other on their inner ends,
said terminals being disposed in said housing in parallel spaced-apart relationship,
interengaging means in said housing and said arms,
said terminals supporting said sidewalls against movement towards and away from each other and said housing supporting said terminals in parallel spaced-apart relationship.

13. A multi-contact electrical connector comprising:

a channel-shaped housing comprising a base member and a pair of sidewalls extending from opposite edge portions of said base member, said housing being of a relatively thin walled material, said arms being flexible towards and away from each other,
a plurality of contact-receiving openings in said base member and extending transversely thereacross,
said sidewalls each being provided with a window in alignment with said openings,
contact terminals in each of said openings and having arms extending beside the associated windows in said sidewalls,
said arms having means interengaging with said windows and preventing outward movement of said sidewalls.

14. A multi-contact electrical connector adapted for use with a printed circuit board, said connector comprising:

a generally open U-shaped supporting means, said supporting means being of a relatively thin insulating material and having a pair of sidewalls, said sidewalls being flexible towards and away from each other,
contact terminals in said supporting means, said terminals having a pair of parallel spaced-apart arms, said arms being integral with each other on their inner ends,
said terminals being disposed in said supporting means in parallel spaced-apart relationship,
interengaging means in said supporting means and said arms,
said terminals supporting said sidewalls against movement towards and away from each other and said supporting means supporting said terminals in parallel spaced-apart relationship.

15. In combination with a panel member such as a printed circuit mother board, a printed circuit board connector mounted on said panel, said connector comprising an elongated channel-shaped housing having a web and sidewalls, said web being spaced from, and parallel to, said panel,
a plurality of contact terminals, said terminals extending through said web and having forward portions disposed between said sidewalls and rearward portions extending exteriorly of said web,
the ends of said rearward portions being supported on, and secured to, said panel-like member whereby, said contact terminals support said housing in spaced relationship to said panel-like member.

References Cited

UNITED STATES PATENTS

| | | | |
|---|---|---|---|
| 2,762,026 | 9/1956 | Knohl | 339—217 X |
| 2,935,725 | 5/1960 | Fox | 339—217 X |
| 2,999,997 | 9/1961 | Tuchel | 339—176 X |
| 3,075,167 | 1/1963 | Kinkaid | 339—217 X |
| 3,107,963 | 10/1963 | Hansen | 339—217 X |
| 3,176,261 | 3/1965 | Greco et al. | 339—217 X |
| 3,351,891 | 11/1967 | Schneck | 339—217 X |
| 3,363,224 | 1/1968 | Gluntz | 339—217 X |

DAVID J. WILLIAMOWSKY, Primary Examiner

P. C. KANNAN, Assistant Examiner

U.S. Cl. X.R.

339—17, 220